United States Patent
Zhang et al.

(10) Patent No.: US 11,609,274 B2
(45) Date of Patent: Mar. 21, 2023

(54) BATTERY STATE DETECTION DEVICE AND VEHICLE DEVICE

(71) Applicant: GUANGZHOU AUTOMOBILE GROUP CO., LTD., Guangzhou (CN)

(72) Inventors: Chen Zhang, San Jose, CA (US); Meng Yao, Sunnyvale, CA (US); Meng Wang, Sunnyvale, CA (US); Xiaohui Li, Sunnyvale, CA (US); Bozhi Yang, Sunnyvale, CA (US)

(73) Assignee: GUANGZHOU AUTOMOBILE GROUP CO., LTD., Guangzhou (CN)

( * ) Notice: Subject to any disclaimer, the term of this patent is extended or adjusted under 35 U.S.C. 154(b) by 0 days.

(21) Appl. No.: 17/370,159

(22) Filed: Jul. 8, 2021

(65) Prior Publication Data
US 2023/0015814 A1    Jan. 19, 2023

(51) Int. Cl.
| | |
|---|---|
| *G01R 31/3835* | (2019.01) |
| *H02J 7/00* | (2006.01) |
| *B60L 58/10* | (2019.01) |
| *G01R 31/392* | (2019.01) |
| *H01M 10/48* | (2006.01) |
| *H01M 10/42* | (2006.01) |
| *G01R 31/389* | (2019.01) |

(52) U.S. Cl.
CPC ......... *G01R 31/3835* (2019.01); *B60L 58/10* (2019.02); *G01R 31/389* (2019.01); *G01R 31/392* (2019.01); *H01M 10/4257* (2013.01); *H01M 10/4264* (2013.01); *H01M 10/48* (2013.01); *H02J 7/0047* (2013.01); *H01M 2010/4271* (2013.01); *H01M 2220/20* (2013.01)

(58) Field of Classification Search
None
See application file for complete search history.

(56) References Cited

U.S. PATENT DOCUMENTS

| | | | |
|---|---|---|---|
| 2002/0085397 A1 | 7/2002 | Suzui et al. | |
| 2004/0034508 A1* | 2/2004 | Cheng | G01R 31/42 702/185 |
| 2005/0287402 A1* | 12/2005 | Maly | H01M 8/04597 429/432 |
| 2016/0226276 A1 | 8/2016 | Iwasawa et al. | |
| 2020/0144808 A1* | 5/2020 | Yamane | H02H 5/042 |

FOREIGN PATENT DOCUMENTS

| | | |
|---|---|---|
| CN | 102269798 A | 12/2011 |
| CN | 105452882 A | 3/2016 |
| CN | 109738822 A | 5/2019 |
| CN | 212587580 U | 2/2021 |

\* cited by examiner

Primary Examiner — Jas A Sanghera
(74) Attorney, Agent, or Firm — ScienBiziP, P.C.

(57) ABSTRACT

A vehicle-mounted device for detecting battery state comprises a controller, a load unit, and a switch unit. The load unit is coupled to the battery, the switch unit is coupled between the battery and the load unit. The controller can control the switch unit to disconnect or connect the battery and the load unit at a predefined frequency. The controller can switch the load unit to generate ripple voltage on the battery, and measure the ripple voltage of each battery cell, an abnormal state of a battery can be determined according to the ripple voltage of each battery cell.

18 Claims, 13 Drawing Sheets

BATTERY STATE DETECTION DEVICE AND VEHICLE DEVICE

FIELD

The subject matter herein generally relates to field of battery impedance detection for vehicle devices.

BACKGROUND

As energy crisis and environmental problems intensity, single-powered vehicles and hybrid vehicles have been promoted continuously, and batteries are the energy source of these vehicle devices. In order to ensure good battery performance and extend battery life, it is necessary to continuously test alternating current (AC) impedance of the battery.

Therefore, there is a room for improvement.

BRIEF DESCRIPTION OF THE DRAWINGS

Implementations of the present disclosure will now be described, by way of embodiments, with reference to the attached figures.

DETAILED DESCRIPTION

Figure 1:
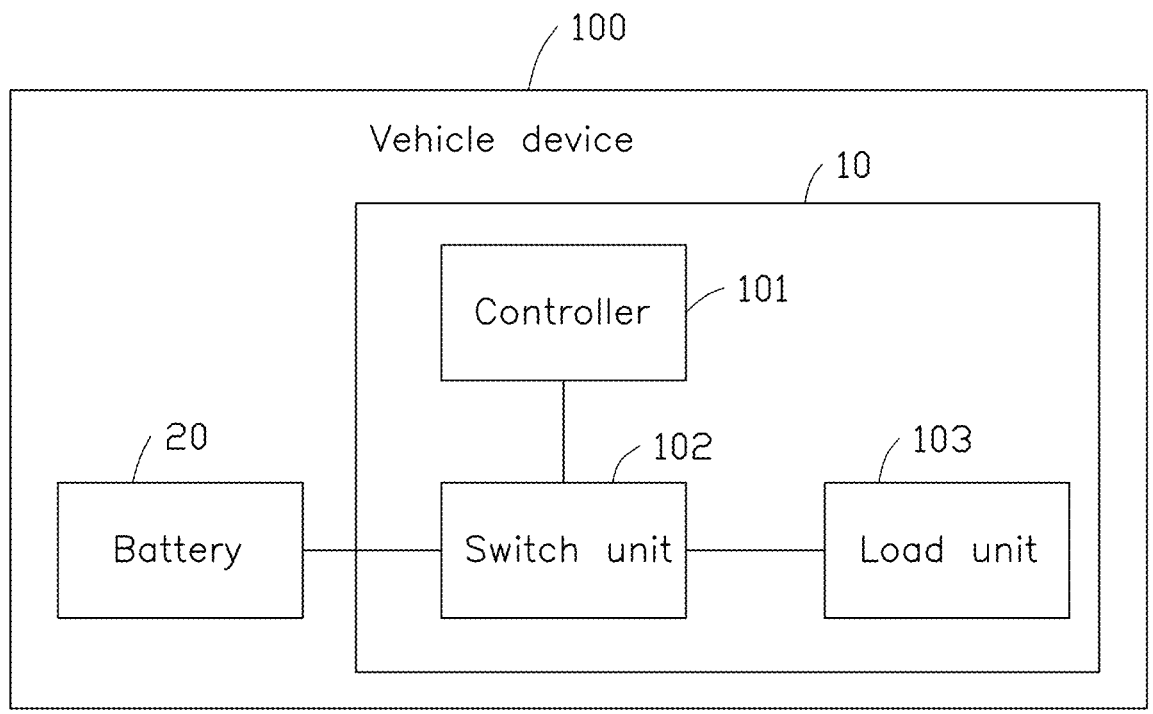
FIG. 1 is block diagram of an embodiment of a device for testing battery state according to the present disclosure.

It will be appreciated that for simplicity and clarity of illustration, where appropriate, reference numerals have been repeated among the different figures to indicate corresponding or analogous elements. Additionally, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "comprising" means "including, but not necessarily limited to"; it specifically indicates open-ended inclusion or membership in a so-described combination, group, series, and the like.

A battery is an electrochemical system, and an equivalent circuit of an electrochemical system can be established, such equivalent circuit being connected by components such as resistance, capacitance, and inductance.

Electrochemical impedance spectroscopy (EIS) is used as a direct indicator to characterize battery states. EIS can measure composition of the equivalent circuit and the size of each component, and then use the electrochemical meaning of these components to analyze the structure of the electrochemical system and the nature of the electrode process.

In some usages, a large number of experiments can be used to establish state of charge (SOC), state of health (SOH), state of safety (SOS) model of the battery, and the current battery health state can be inferred based on different SOC, SOH, and SOS conditions and for predicting battery safety issues.

The battery in a vehicle has very low internal resistance, the voltage ripple of the battery is very low with low current making signal measurement very difficult.

FIG. 1 shows a schematic diagram of one embodiment of a vehicle-mounted device (vehicle device 100) of the present disclosure.

In the embodiment, the vehicle device 100 can include a battery state detection device 10 and a battery 20. The battery 20 provides power for the vehicle device 100. The battery 20 can include a plurality of battery cells (not shown).

It should be noted, the vehicle device 100 may be installed in an electric vehicle or a hybrid vehicle.

In the embodiment, the battery state detection device 10 can include a controller 101, a switch unit 102, and a load unit 103.

The battery state detection device 10 is electrically coupled to the battery 20. The controller 101 is electrically coupled to the switch unit 102, and the switch unit 102 is electrically coupled between the load unit 103 and the battery 20. The switch unit 102 disconnects or connects the battery 20 from or to the load unit 103 according to the control signal of the controller 101.

The battery 20 is used to provide power to the load unit 103. The controller 101 is used to turn on or turn off the switch unit 102 with a predefined frequency. Based on this design, the ripple voltage can be generated on battery by switching the load unit 103. The controller 101 can measure the ripple voltage of each battery cell, and determine whether battery is in abnormal state.

Figure 2:
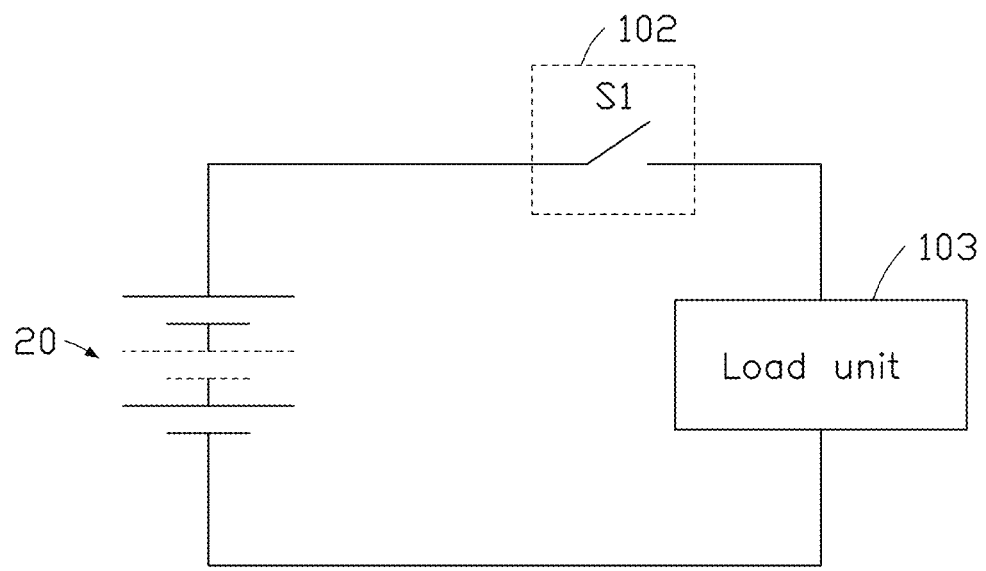
FIG. 2 is schematic diagram of an embodiment of the battery state detecting device according to the present disclosure.

FIG. 2 shows a circuit diagram of one embodiment of a device for detecting the state of a battery (battery state detection device 10) of the present disclosure.

In the embodiment, the switch unit 102 can include a switch S1, and a positive electrode of the battery 20 is electrically coupled to a first terminal of the switch S1, a second terminal of the switch S1 is electrically coupled to a first terminal of the load unit 103, and a third terminal of the switch S1 is electrically coupled to a controller 101. A second terminal of the load unit 103 is electrically coupled to a negative electrode of the battery 20. In one embodiment, the load unit 103 can include a resistor, a capacitor, or an inductor.

It should be noted that, the controller 101 can turn on or turn off the switch S1 with a predefined frequency. In one embodiment, the predefined frequency can be within the range of 0-1000 Hz.

Battery undergoes complicated chemical reactions during charging and discharging. The embodiment of the present disclosure uses the equivalent circuit disclosed to model the relationship of terminal voltage and current.

Figure 3:
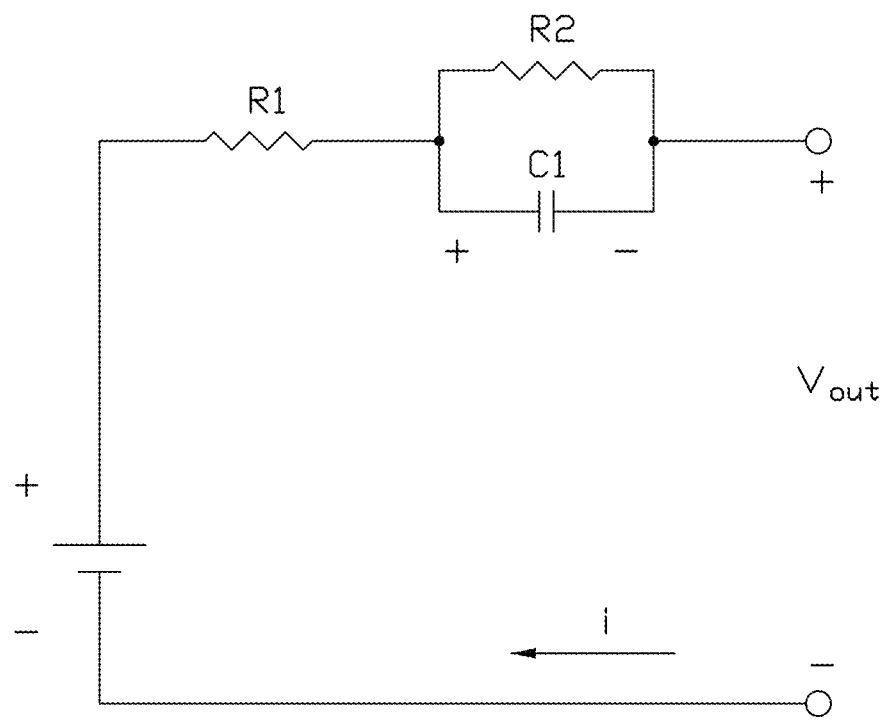
FIG. 3 is schematic diagram of an embodiment of a battery charging circuit according to the present disclosure.

As shown in FIG. 3, the circuit can include a resistor R1, a resistor R2, a capacitor C1, and a voltage source V1.

In the embodiment, a first terminal of the resistor R1 is electrically coupled to a positive electrode of the voltage source V1, a second terminal of the resistor R1 is electrically coupled to a first terminal of the resistor R2 and a first terminal of the capacitor C1, and a second terminal of the resistor R2 and a second terminal of the capacitor C1 are electrically coupled to a first terminal of an output terminal Vout. A negative electrode of the voltage source V1 is electrically coupled to the second terminal of the output terminal Vout.

When one battery cell is subject to substantial internal reactions, voltage difference variation will be observed from the terminal voltage. When the current is varied in the system, and the voltage of each cell terminal can be measured.

To figure out the behavior difference of the battery cells, a large current variation is imposed on DC bus sides. For example, variation of current more than 20 A, equivalent to 7 kW in a 350 V battery system.

In some possible application scenarios, a vehicle itself can introduce high frequency load changes to battery.

Figure 4:
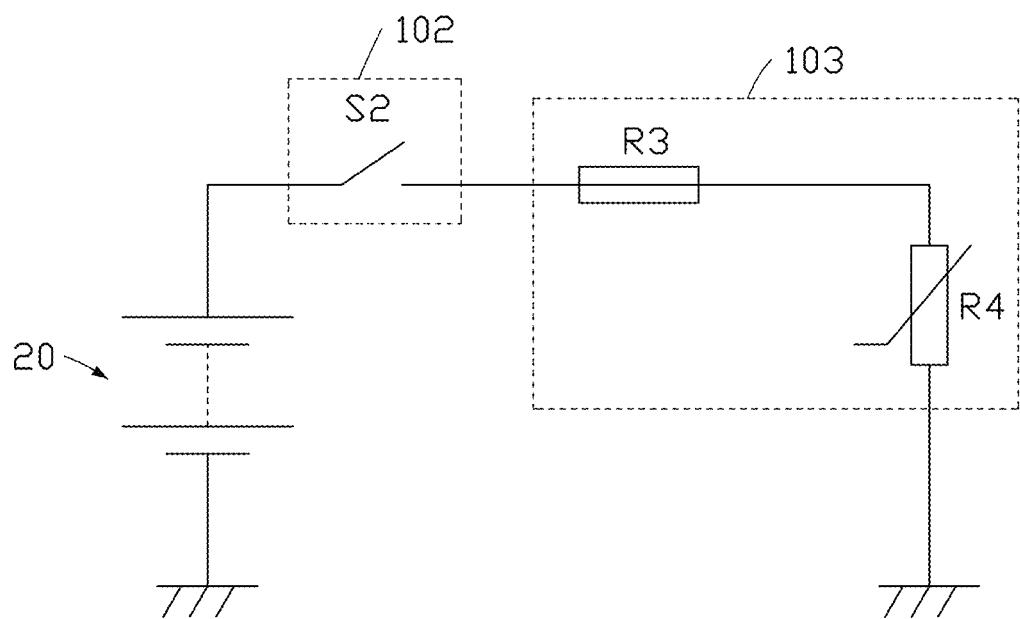
FIG. 4 is schematic diagram of another embodiment of the battery state detecting device according to the present disclosure.

FIG. 4 shows a schematic diagram of another embodiment of the battery state detection device 10 of the present disclosure.

The switch unit 102 can include a switch S2, and the load unit 103 can include a resistor R3, and a thermistor R4. In the embodiment, the thermistor R4 can be positive temperature coefficient (PTC) resistor.

In the embodiment, a negative electrode of the battery 20 is grounded, a positive electrode of the battery 20 is electrically coupled to a first terminal of the switch S2, and a second terminal of the switch S2 is electrically coupled to a first terminal of the resistor R3. A second terminal of the resistor R3 is grounded through the thermistor R4.

In one embodiment, the state of the switch S2 can be controlled by the controller 101. For example, a third terminal of the switch S2 is electrically coupled to the controller 101, and the controller 101 can output a control signal to the switch S2, to turn on or off the switch S2.

In the embodiment, PTC refers to materials that experience an increase in electrical resistance when their temperature is raised. For example, a PTC heater can provide a heat source in an EV or a PHEV by using electric power while maintaining the safety of heating. The electricity is provided by DC high voltage of battery. The PTC can be used to heat coolant or air. The PTC is controlled by switch devices such as (insulated gate bipolar transistor) IGBT, or (metal-oxide-semiconductor field-effect transistor) MOSFET, or physical contactors to regulate the output power and temperature.

Figure 5:
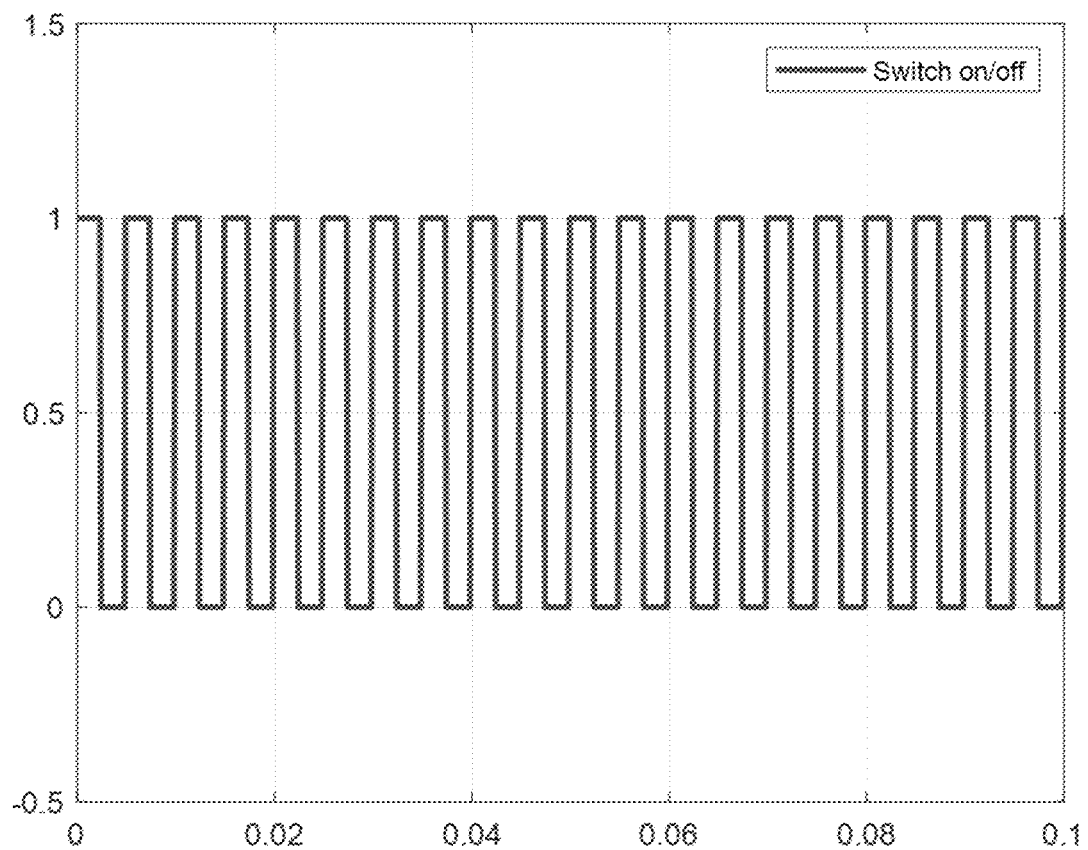
FIG. 5 is schematic diagram of switching patterns in battery under test according to the present disclosure.

FIG. 5 shows a schematic diagram of switching patterns. The embodiment of the present disclosure can control the switching frequency and duty cycle of the switch, to achieve impedance measurement. For example, the switching frequency can be 200 Hz, and the duty cycle can be 50%.

Figure 6:
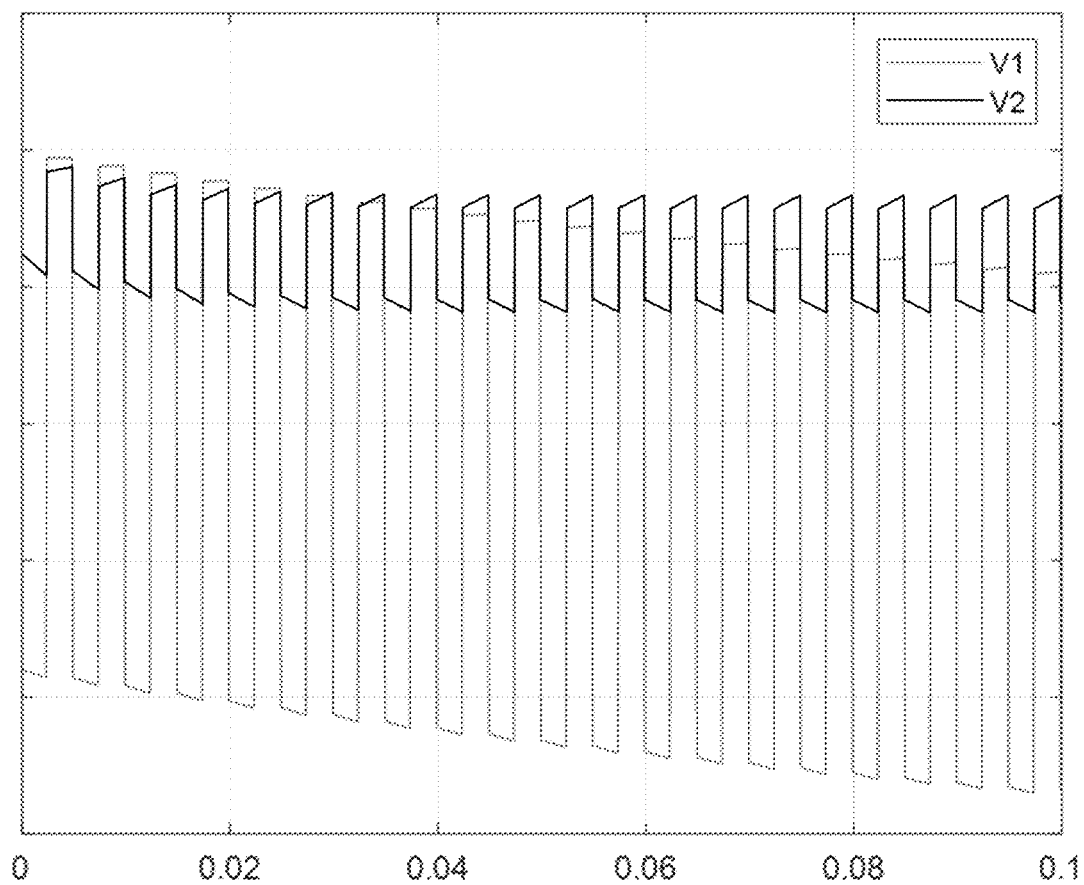
FIG. 6 is schematic diagram of terminal voltage of two serially connected battery cells with on/off control of resistance load according to the present disclosure.

FIG. 6 shows terminal voltage of two serially connected battery cells with on/off control of resistance load.

It is understandable that, V1 is the voltage of a battery cell 1 and V2 is the voltage of a battery cell 2. If there is a difference between the battery cell 1 and the battery cell 2, the voltage performance between the battery cell 1 and the battery cell 2 will be different.

Figure 7:
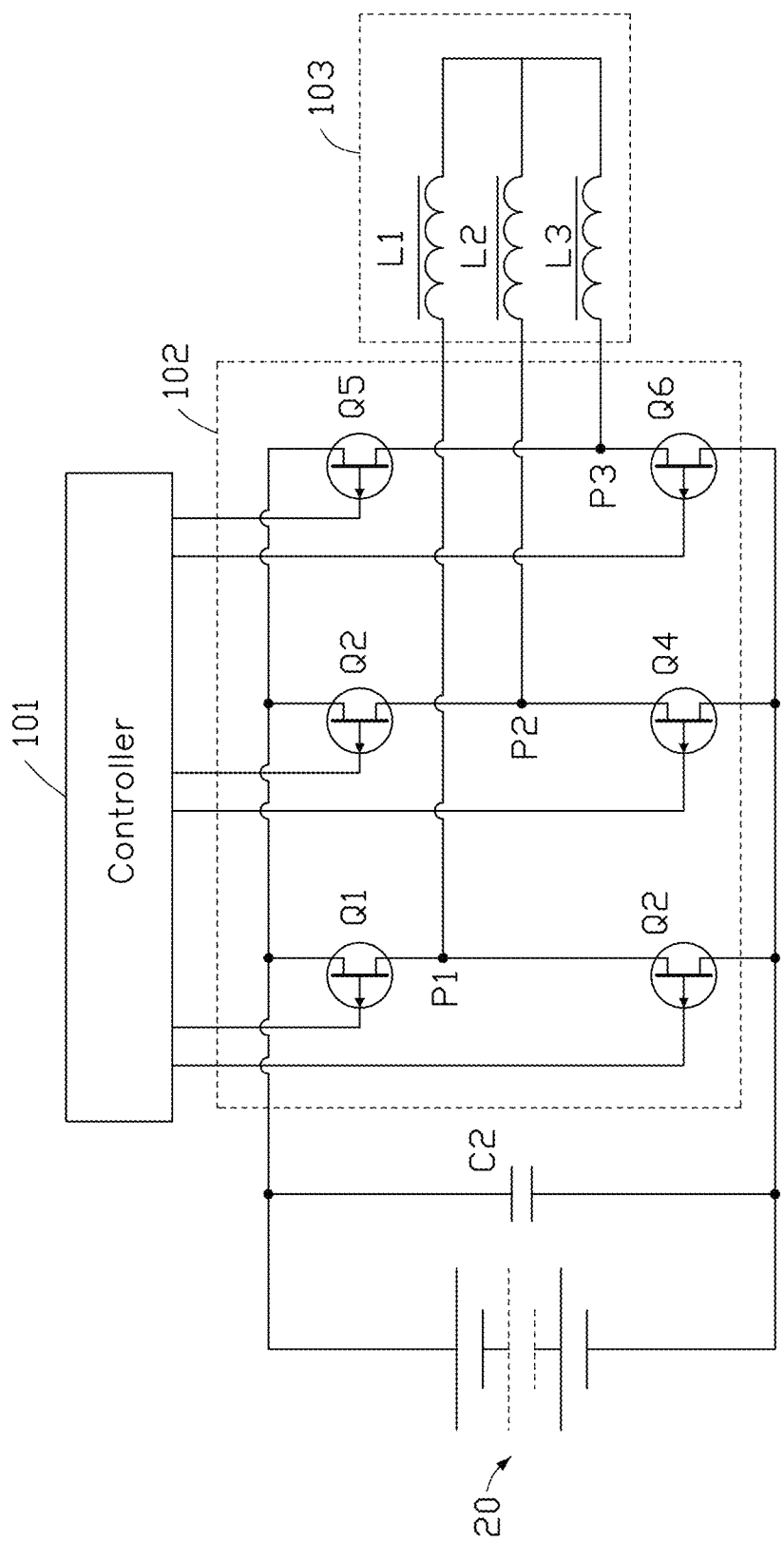
FIG. 7 is schematic diagram of another embodiment of the battery state detecting device according to the present disclosure.

FIG. 7 shows a schematic diagram of another embodiment of a battery state detection device 10 of the present disclosure.

In one embodiment, the battery 20 can be a direct current (DC) source, the switch unit 102 can be an inverter, and the load unit 103 can be a motor. The load unit 103 can include an inductor L1, an inductor L2, and an inductor L3.

The load unit 103 provides torque to drive vehicle in electric and hybrid electric vehicles. The power source of the motor is high voltage DC voltage. The inverter converts the DC source to AC power by applying a certain switching order.

The inductance in the motor provides impedance to the DC power, which serves to control the current while trying to create short circuit with high frequency.

In the embodiment, the switch unit 102 can include a switch Q1, a switch Q2, a switch Q3, a switch Q4, a switch Q5, and a switch Q6.

In one embodiment, a first terminal of the switch Q1 is electrically coupled to the controller 101, a second terminal of the switch Q1 is electrically coupled to a positive electrode of the battery 20 and a first terminal of a capacitor C2, and a third terminal of the switch Q1 is electrically coupled to a second terminal of the switch Q2. A node P1 between the third terminal of the switch Q1 and the second terminal of the switch Q2 is electrically coupled to the inductor L1 of the load unit 103.

In one embodiment, a first terminal of the switch Q2 is electrically coupled to the controller 101, and a third terminal of the switch Q2 is electrically coupled to a negative electrode of the battery 20 and a second terminal of the capacitor C2.

In one embodiment, a first terminal of the switch Q3 is electrically coupled to the controller 101, a second terminal of the switch Q3 is electrically coupled to the positive electrode of the battery 20, and a third terminal of the switch Q3 is electrically coupled to a second terminal of the switch Q4. A node P2 between the third terminal of the switch Q3 and the second terminal of the switch Q4 is electrically coupled to the inductor L2 of the load unit 103.

In one embodiment, a first terminal of the switch Q4 is electrically coupled to the controller 101, and a third terminal of the switch Q4 is electrically coupled to the negative electrode of the battery 20.

In one embodiment, a first terminal of the switch Q5 is electrically coupled to the controller 101, a second terminal of the switch Q5 is electrically coupled to the positive electrode of the battery 20, and a third terminal of the switch Q5 is electrically coupled to a second terminal of the switch Q6. A node P3 between the third terminal of the switch Q5 and the second terminal of the switch Q6 is electrically coupled to the inductor L3 of the load unit 103.

In one embodiment, a first terminal of the switch Q6 is electrically coupled to the controller 101, and a third terminal of the switch Q6 is electrically coupled to the negative electrode of the battery 20.

As shown in in FIG. 7, the controller 101 can control the working status of the switches Q1-Q6. For example, the controller 101 may output control signals to the switches Q1-Q6.

The switch Q1 and the switch Q2 form a leg a, the switch Q3 and the switch Q4 form a leg b, and the switch Q5 and the switch Q6 form a leg c.

In one embodiment, DC load is converted to energy in the inductors L1-L3. Part of the energy stored in the inductors L1-L3 is converted to iron loss in the motor 300 due to high frequency. Part of the energy stored in the inductors L1-L3 is returned to the filtering DC capacitor in the load unit 103. Through this way, the battery state detection device 10 creates variation load at DC side.

Figure 8:
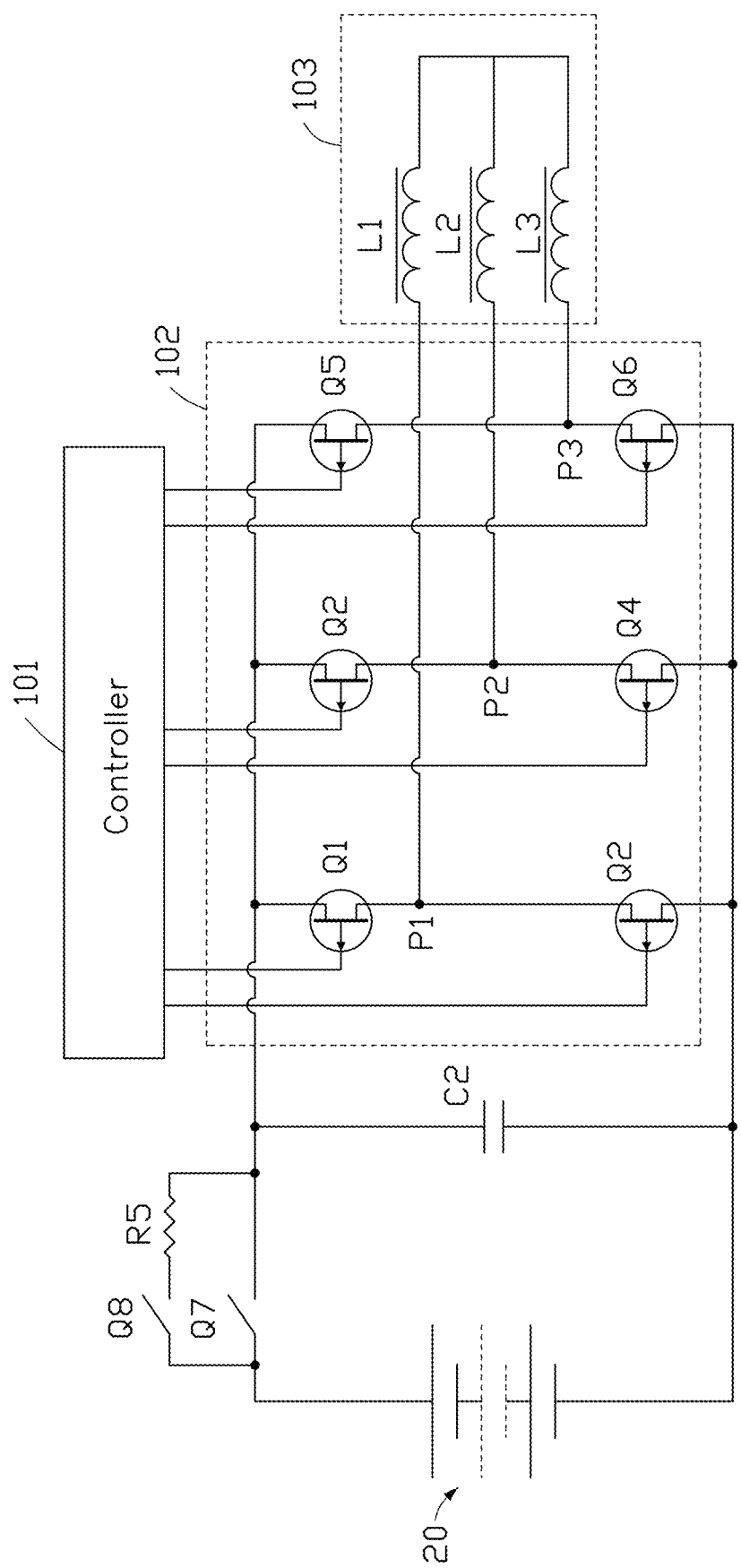
FIG. 8 is schematic diagram of another embodiment of the battery state detecting device according to the present disclosure.

FIG. 8 shows a schematic diagram of another embodiment of a battery state detection device 10 of the present disclosure.

The difference between the battery state detection device 10 shown in FIG. 8 and the battery state detection device 10 shown in FIG. 7 is:

In the embodiment, the battery state detection device 10 further includes a switch Q7, a switch Q8, and a resistor R5.

In the embodiment, a first terminal of the switch Q7 is electrically coupled to the positive electrode of the battery 20, a second terminal of the first terminal of the capacitor C1, and a third terminal of the switch Q7 is electrically coupled to controller 101. A first terminal of the switch Q8 is electrically coupled to the first terminal of the switch Q7, and a second terminal of the switch Q8 is electrically coupled to the first terminal of the capacitor C1 through the resistor R5.

It is should be noted, the resistor R5 can be pre-charge resistance of battery high voltage system. A pre-charge circuit in the high voltage system is for connecting the high voltage to its load to avoid current surge when the main contractor is closed.

In some electric vehicles, there may be several high voltage sources (one of them is HV battery) in the system. Therefore, the embodiment of the present disclosure uses one voltage source to charge another voltage source, and the control of charging current can be switched on/off through control system in a preferred frequency.

Figure 9:
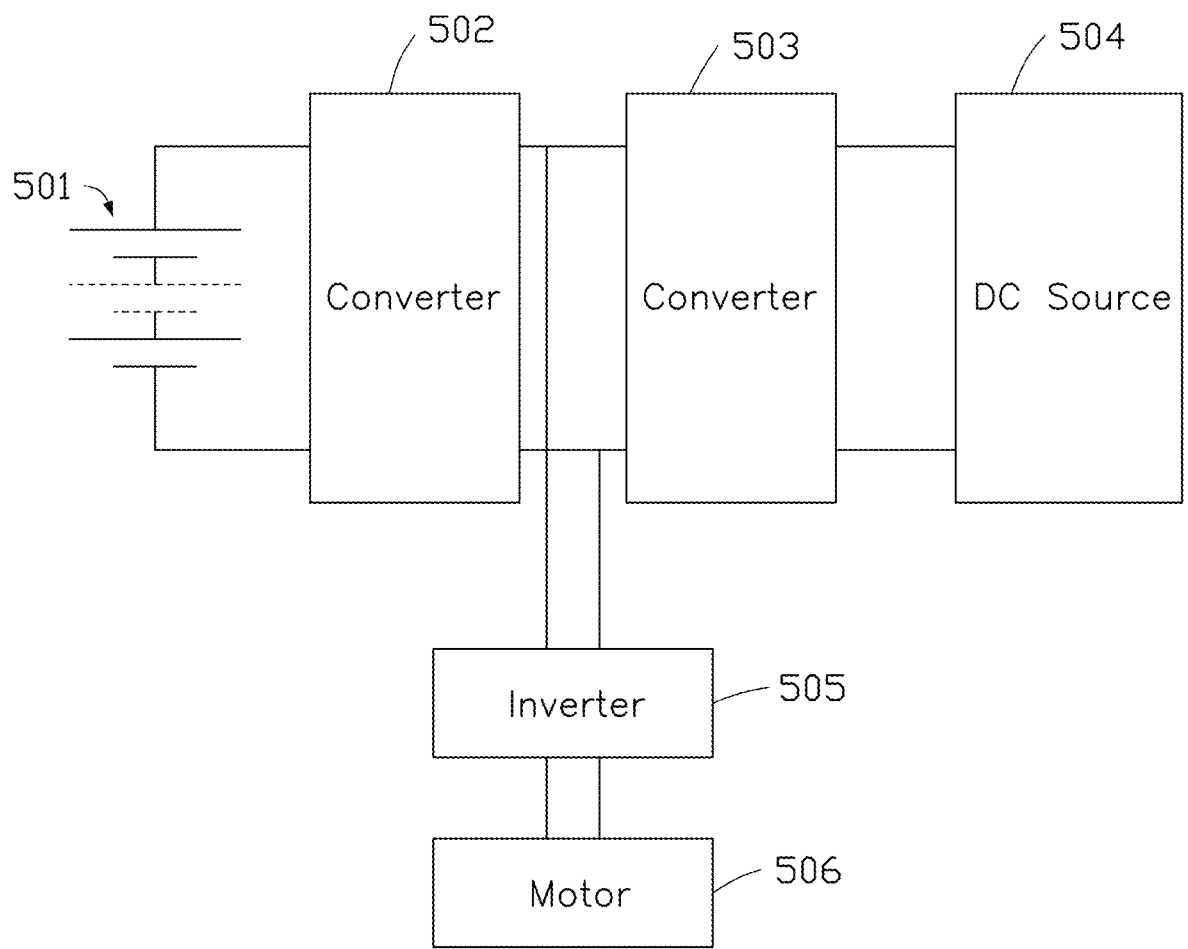
FIG. 9 is schematic diagram of another embodiment of the battery state detecting device according to the present disclosure.

FIG. 9 shows a schematic diagram of another embodiment of a battery state detection device 10 of the present disclosure.

The battery state detection device 10 can include a HV battery 501, a converter 502, a converter 503, a DC source 504, an inverter 505, and a motor 506.

In the embodiment, the converter 502 and the converter 503 are direct current-direct current converters.

The HV battery 501 is electrically coupled to the converter 502, the converter 502 is electrically coupled to the converter 503, and the converter 503 is electrically coupled to the DC source 504. The inverter 505 is electrically coupled to the converter 502, and the motor 506 is electrically coupled to the inverter 505.

In some application scenarios, the battery in the electric vehicles is charged through on-board or external charger, and the charger generates pulse charge current to charge the battery.

For example, battery management system (BMS) sends normal current request to the charger, and the charger delivers the current according to the request. After a half cycle, the BMS sends 0 or very low current to the charger, and the charger follows the new demand to regulate the current to the target value. After a half cycle, the BMS sends the normal desired current to the charger, and repeats the above process for a certain window period (such as 1s).

In the embodiment, the BMS measures each battery cell voltage, if the sampling time is consistent for all BMS in the vehicle device, and sampling frequency is fast enough to measure the cell voltage changes.

In one embodiment, the present disclosure provides a sampling method, the sampling rate should not be an integer multiple of the target signal period.

For example, if the sampling time is 10 ms and the target frequency is 200 Hz, the ripple frequency should be controlled at 190 Hz, and avoid at 200 Hz. The following table 1 shows an example of adjusted frequency compared with the original target frequency.

TABLE 1

| adjusted frequency and target frequency for impedance shift test | | | |
|---|---|---|---|
| Frequency of target signals | Period of target signals | Period target | Frequency target |
| 50 | 0.02 | 0.23 | 43.478 |
| 100 | 0.01 | 0.0091 | 109.89011 |
| 200 | 0.005 | 0.0049 | 204.0816 |
| 300 | 0.00033333 | 0.0035 | 285.7143 |
| 500 | 0.002 | 0.0019 | 526.3158 |
| 1000 | 0.001 | 0.0011 | 909.0909 |

Figure 10:
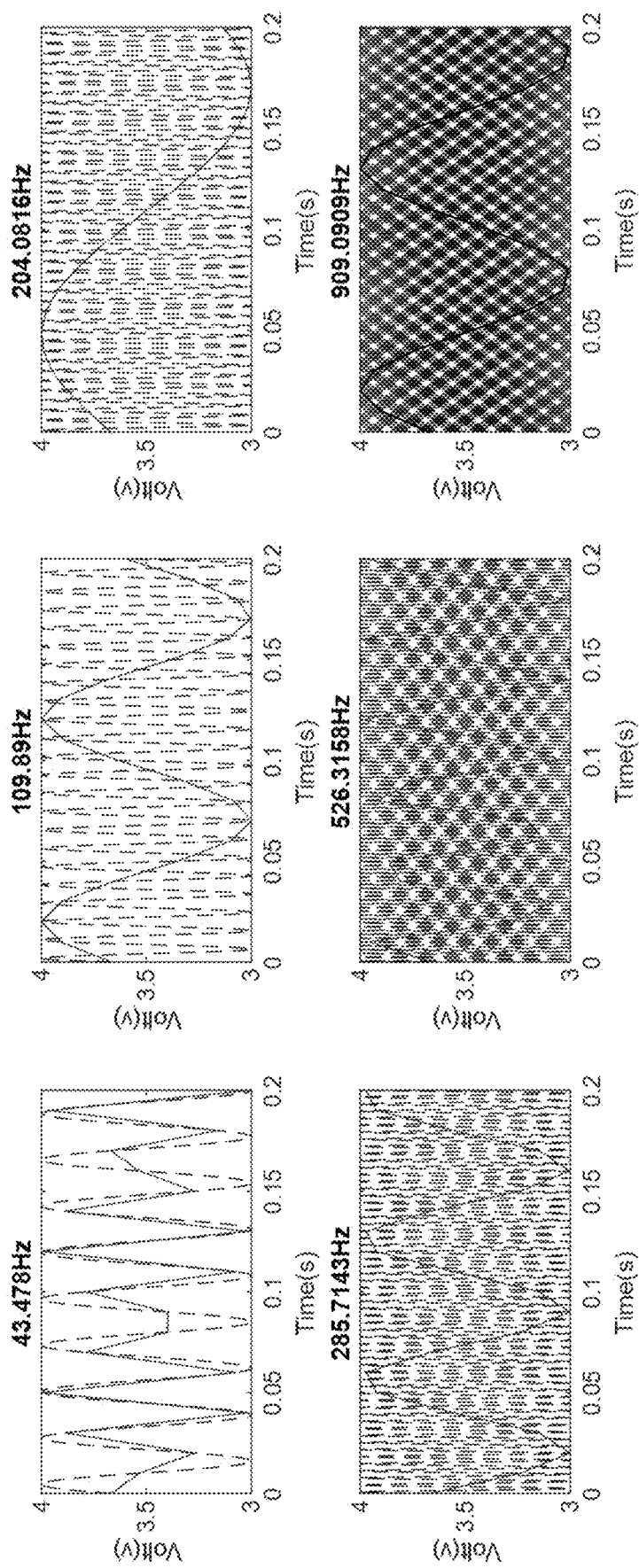
FIG. 10 is schematic diagram of the time trace of the sampled signal and the original signal at different frequencies according to the present disclosure.

FIG. 10 shows the time trace of the sampled signal and the original signal at different frequencies, and the effectiveness of the sampling method to phase shift estimation is shown through the correlation study of these sampled data with low frequency in simulation.

Figure 11:
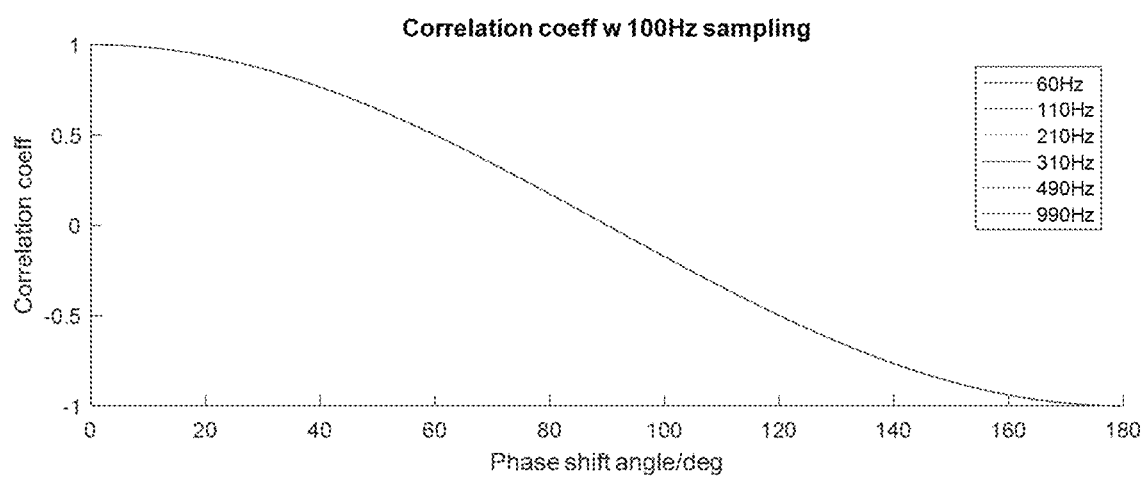
FIG. 11 is schematic diagram of the correlation study of different frequency data according to the present disclosure.

FIG. 11 shows the correlation study under different frequency data, and all curves overlap with each other. For different frequency signals, the correlation coefficient of the sampled data converges to its ideal curve-cos(phi), where phi is the phase shift angle. The sampling method mentioned in present disclosure can find the peak and valley of sampled data, which can be used for impedance magnitude calculation.

Figure 12A:
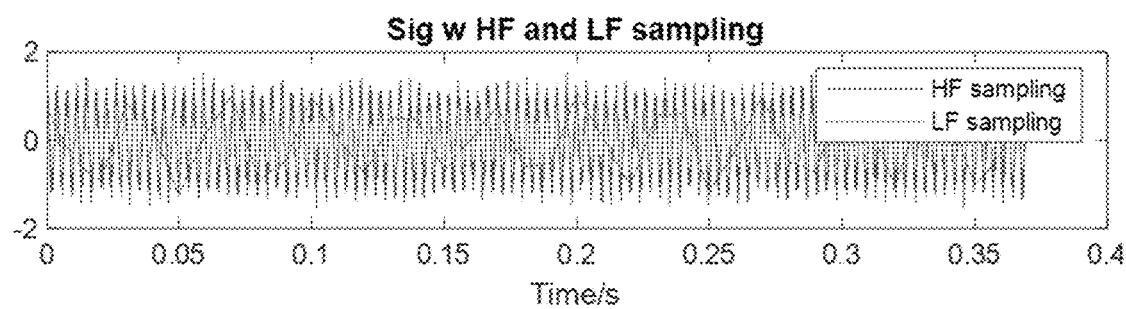
FIGS. 12a-12e are schematic diagrams of the influence of noise on angle calculation according to the present disclosure.
Figure 12B:
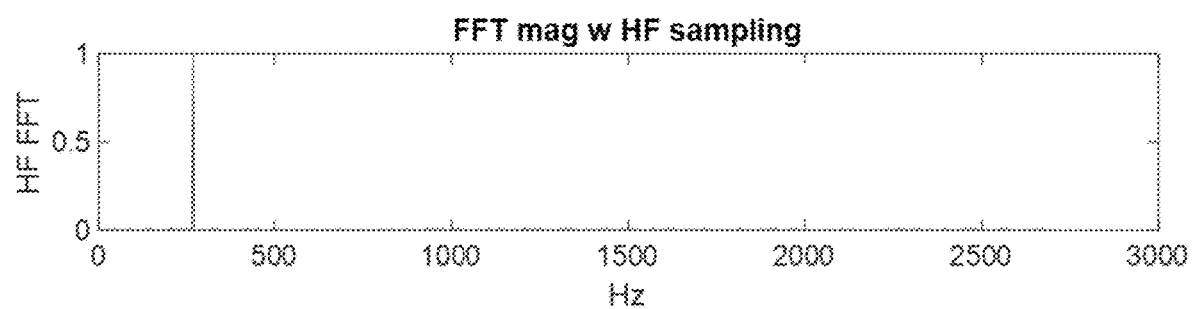
Figure 12C:
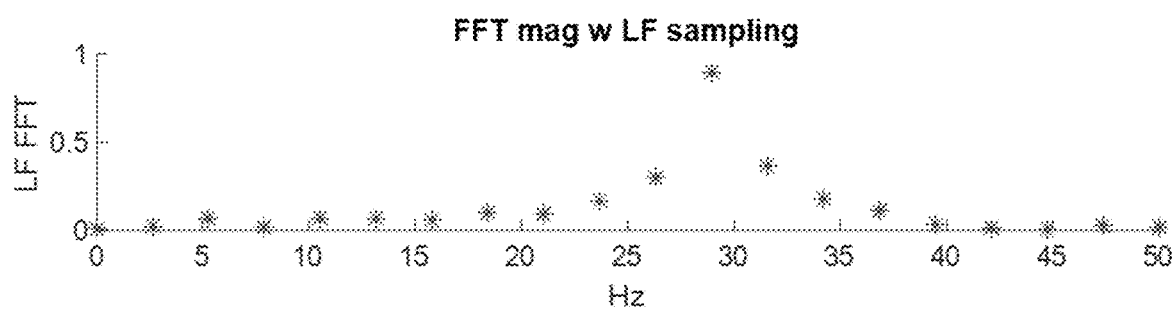
Figure 12D:
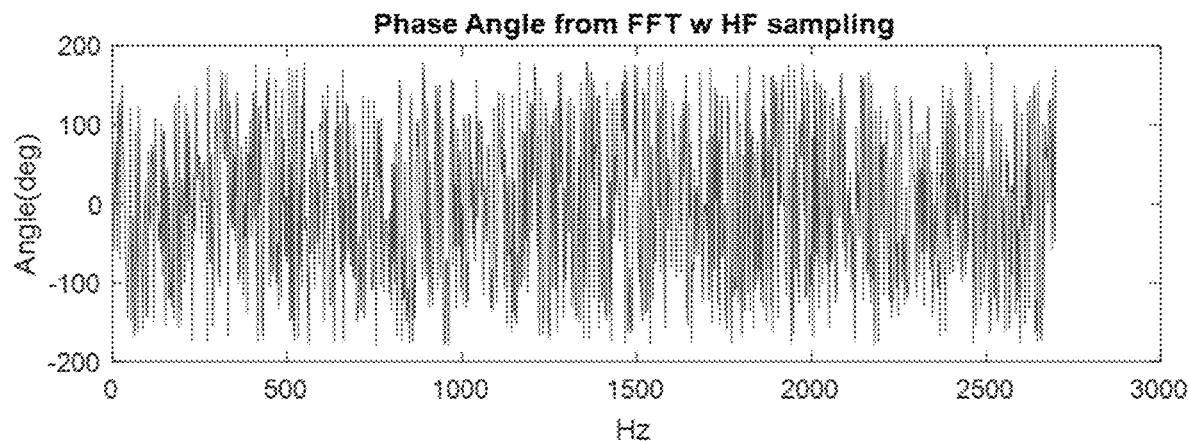
Figure 12E:
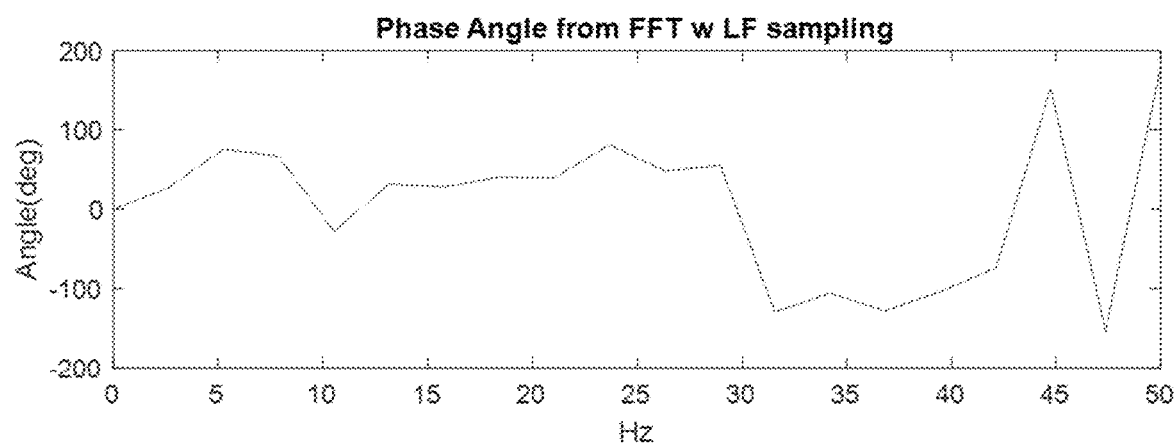

It is worth mentioning that the noise impact to the angle calculation is significant. FIG. 12a shows signals with different sampling, FIG. 12b shows magnitude of FFT with high frequency sampling, FIG. 12c shows FFT with low frequency sampling, FIG. 12d shows angle of FFT with high frequency sampling, FIG. 12e shows angle of FFT with low frequency sampling.

In the embodiment, the phase angle from FFT can be weighted through multiplication of the power density of that frequency (square of the magnitude). For example, at frequency of 10 Hz, the magnitude is 0.02 and the angle is −50 deg. The weighted angle is −50*(0.02^2)=−0.02 deg, which is very small and ruled out from the final pick. The present disclosure finds the frequency that has the maximum absolute weighted angles. The present disclosure further finds the original angle corresponding to the target frequency. The present disclosure further finds the angle difference between two target cells.

The metrics to measure the state of battery 13 are as follows, not being limited to impedance magnitude and impedance phase difference of cells. In one embodiment, the following formula (1) is used to calculate the battery DC resistance magnitude.

$$Resistance = delta\_V/delta\_I \qquad (1)$$

In the above formula (1), delta_V is the voltage change before and after the load switched on/off and delta_I is the current change before and after load is switched on/off.

In another embodiment, the impedance magnitude is calculated through fast Fourier transform (FFT), the amplitude of each frequency indicates the magnitude of that component.

It should be noted that, the method of the present disclosure can also calculate the impedance at the target frequency, and the impedance at the target frequency satisfies the following formula (2).

$$Imp = \frac{V_{Am}(f_{trg})}{I_{Am}(f_{trg})} \qquad (2)$$

In the above formula (2), $V_{Am}(f_{trg})$ is the amplitude of each cell voltage's FFT at the tested frequency (known and given) $f_{trg}$, and $I_{Am}(f_{trg})$ the amplitude of battery current at the tested frequency (known and given) $f_{trg}$.

The embodiment of the present disclosure may calculate the phase difference among cells through the following formula (3).

$$R_{i,j} = \frac{\sum (V_i - \overline{V}_i)(V_j - \overline{V}_j)}{\sqrt{\sum (V_i - \overline{V}_i)^2 \sum (V_j - \overline{V}_j)^2}} \qquad (3)$$

In the above formula (3), $R_{i,j}$ is the correlation coefficient of the linear relationship between voltage $V_i$ and voltage $V_j$, $V_i$ is the voltage of the cell I, $V_j$ is the voltage of cell j, and $\overline{V}$ is the mean voltage of the cell (i or j).

The phase difference between two cells is calculated by the following formula (4).

$$\theta_{shift} = \arccos(R_{i,j}) \qquad (4)$$

In another embodiment, the phase shift can be calculated through fast Fourier transform (FFT), and the angle of each frequency can indicate the phase of that component. The phase difference of two cells can indicate the phase shift.

The results of angle from FFT may be too noisy sometimes, and the data process only compares the phase angle for the target frequency.

In the embodiment, cell voltage phase difference can be calculated locally by BMS or by the cloud.

For example, BMS can measure cells' voltage phase of the battery 13 through the same board, the average phase shift is calculated by removing 1-2 outliers, and the average voltage phase in this small group is compared with other groups in the battery 13. Therefore, possible inconsistencies of time synchronization on different boards may be compensated for, and the outliers found in the comparison can indicate an abnormal state of a battery cell.

The calculated voltage phase and the abnormal battery cell characters can be uploaded to cloud, and big data will help to analyze such data in a vehicle fleet and can cross-check with any abnormality found by BMS in the vehicle device.

For example, the measured voltage for each battery cell can be uploaded from vehicle's T-box to cloud. It should be noted that big data analysis in the cloud is applied to evaluate battery voltage phase for an entire vehicle fleet, through which some cells having a different behavior can be found. The outliers may have high risk, since phase shift may change because of temperature changes during thermal runaway.

Even though numerous characteristics and advantages of the present technology have been set forth in the foregoing description, together with details of the structure and function of the present disclosure, the disclosure is illustrative only, and changes may be made in the detail, especially in matters of shape, size, and arrangement of the parts within the principles of the present disclosure, up to and including the full extent established by the broad general meaning of the terms used in the claims. It will therefore be appreciated that the exemplary embodiments described above may be modified within the scope of the claims.

What is claimed is:

1. A battery state detection device configured for detecting state of a battery, comprising:
    a controller;
    a load unit coupling to the battery, and receiving power from the battery; and
    a switch unit coupling between the battery and the load unit, and receiving control signals from the controller,
    wherein the controller controls the switch unit to disconnect or connect between the battery and the load unit with a predefined frequency, and
    wherein the controller switches the load unit to generate ripple voltages on the battery, and measure the ripple voltage of each battery cell, and determine if the battery is abnormal according to the ripple voltage of each battery cell;
    wherein the battery state detection device further comprises a first switch, a second switch, and a first resistor, a first terminal of the first switch is electrically coupled to a positive electrode of the battery, a second terminal of the first switch is electrically coupled to a negative electrode of the battery through a first capacitor, a first terminal of the second switch is electrically coupled to the first terminal of the first switch, and a second terminal of the second switch is electrically coupled to the first capacitor through the first resistor.

2. The battery state detection device according to claim 1, wherein the switch unit comprises a third switch, and the positive electrode of the battery is electrically coupled to a first terminal of the third switch, a second terminal of the third switch is electrically coupled to a first terminal of the load unit, a third terminal of the third switch is electrically coupled to the controller, a second terminal of the load unit is electrically coupled to the negative electrode of the battery.

3. The battery state detection device according to claim 1, wherein the switch unit comprises a third switch, and the load unit comprises a second resistor, and a thermistor, the negative electrode of the battery is grounded, the positive electrode of the battery is electrically coupled to a first terminal of the third switch, a second terminal of the third switch is electrically coupled to a first terminal of the second resistor, a second terminal of the second resistor is grounded through the thermistor, and a third terminal of the third switch is electrically coupled to the controller.

4. The battery state detection device according to claim 1, wherein the switch unit comprises a third switch and a fourth switch, a first terminal of the third switch is electrically coupled to the controller, a second terminal of the third switch is electrically coupled to the positive electrode of the battery and a first terminal of a second capacitor, a third terminal of the third switch is electrically coupled to a second terminal of the fourth switch, a first terminal of the fourth switch is electrically coupled to the controller, a third terminal of the fourth switch is electrically coupled to the negative electrode of the battery and a second terminal of the second capacitor.

5. The battery state detection device according to claim 4, wherein the switch unit further comprises a fifth switch and a sixth switch, a first terminal of the fifth switch is electrically coupled to the controller, a second terminal of the fifth switch is electrically coupled to the positive electrode of the battery, a third terminal of the fifth switch is electrically coupled to a second terminal of the sixth switch, a first terminal of the sixth switch is electrically coupled to the controller, a third terminal of the sixth switch is electrically coupled to the negative electrode of the battery.

6. The battery state detection device according to claim 5, wherein the switch unit further comprises a seventh switch and an eighth switch, a first terminal of the seventh switch is electrically coupled to the controller, a second terminal of the seventh switch is electrically coupled to the positive electrode of the battery, a third terminal of the seventh switch is electrically coupled to a second terminal of the eighth switch, a first terminal of the eighth switch is electrically coupled to the controller, a third terminal of the eighth switch is electrically coupled to the negative electrode of the battery.

7. The battery state detection device according to claim 4, wherein the load unit comprises a first inductor, a first node between the third terminal of the third switch and the second terminal of the fourth switch is electrically coupled to the first inductor of the load unit.

8. The battery state detection device according to claim 5, wherein the load unit comprises a second inductor, a second node between the third terminal of the fifth switch and the second terminal of the sixth switch is electrically coupled to the second inductor of the load unit.

9. The battery state detection device according to claim 6, wherein the load unit comprises a third inductor, a third node between the third terminal of the seventh switch and the second terminal of the eighth switch is electrically coupled to the third inductor of the load unit.

10. A vehicle device, comprising:
a battery; and
a battery state detection device coupling to the battery, and comprising:
a controller;
a load unit coupling to the battery, and receiving power from the battery; and
a switch unit coupling between the battery and the load unit, and receiving control signals from the controller,
wherein the controller controls the switch unit to disconnect or connect between the battery and the load unit with a predefined frequency, and
wherein the controller switches the load unit to generate ripple voltages on the battery, and measure the ripple voltage of each battery cell, and determine if the battery is abnormal battery according to the ripple voltage of each battery cell;
wherein the battery state detection device further comprises a first switch, a second switch, and a first resistor, a first terminal of the first switch is electrically coupled to a positive electrode of the battery, a second terminal of the first switch is electrically coupled to a negative electrode of the battery through a first capacitor, a first terminal of the second switch is electrically coupled to the first terminal of the first switch, and a second terminal of the second switch is electrically coupled to the first capacitor through the first resistor.

11. The vehicle device according to claim 10, wherein the switch unit comprises a third switch, and the positive electrode of the battery is electrically coupled to a first terminal of the third switch, a second terminal of the third switch is electrically coupled to a first terminal of the load unit, a third terminal of the third switch is electrically coupled to the controller, a second terminal of the load unit is electrically coupled to the negative electrode of the battery.

12. The vehicle device according to claim 10, wherein the switch unit comprises a third switch, and the load unit comprises a second resistor, and a thermistor, the negative electrode of the battery is grounded, the positive electrode of the battery is electrically coupled to a first terminal of the third switch, a second terminal of the third switch is electrically coupled to a first terminal of the second resistor, a second terminal of the second resistor is grounded through the thermistor, and a third terminal of the third switch is electrically coupled to the controller.

13. The vehicle device according to claim 10, wherein the switch unit comprises a third switch and a fourth switch, a first terminal of the third switch is electrically coupled to the controller, a second terminal of the third switch is electrically coupled to the positive electrode of the battery and a first terminal of a second capacitor, a third terminal of the third switch is electrically coupled to a second terminal of the fourth switch, a first terminal of the fourth switch is electrically coupled to the controller, a third terminal of the fourth switch is electrically coupled to the negative electrode of the battery and a second terminal of the second capacitor.

14. The vehicle device according to claim 13, wherein the switch unit further comprises a fifth switch and a sixth switch, a first terminal of the fifth switch is electrically coupled to the controller, a second terminal of the fifth switch is electrically coupled to the positive electrode of the battery, a third terminal of the fifth switch is electrically coupled to a second terminal of the sixth switch, a first terminal of the sixth switch is electrically coupled to the controller, a third terminal of the sixth switch is electrically coupled to the negative electrode of the battery.

15. The vehicle device according to claim 14, wherein the switch unit further comprises a seventh switch and a eighth switch, a first terminal of the seventh switch is electrically coupled to the controller, a second terminal of the seventh switch is electrically coupled to the positive electrode of the battery, a third terminal of the seventh switch is electrically coupled to a second terminal of the eighth switch, a first terminal of the eighth switch is electrically coupled to the controller, a third terminal of the eighth switch is electrically coupled to the negative electrode of the battery.

16. The vehicle device according to claim 13, wherein the load unit comprises a first inductor, a node between the third terminal of the third switch and the second terminal of the fourth switch is electrically coupled to the first inductor of the load unit.

17. The vehicle device according to claim 14, wherein the load unit comprises a second inductor, a second node between the third terminal of the fifth switch and the second terminal of the sixth switch is electrically coupled to the second inductor of the load unit.

18. The vehicle device according to claim 15, wherein the load unit comprises a third inductor, a third node between the third terminal of the seventh switch and the second terminal of the eighth switch is electrically coupled to the third inductor of the load unit.

* * * * *